(12) United States Patent
Kurihara et al.

(10) Patent No.: US 6,359,581 B2
(45) Date of Patent: Mar. 19, 2002

(54) ELECTROMAGNETIC WAVE ABOSRBER

(75) Inventors: Hiroshi Kurihara; Motonari Yanagawa, both of Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 09/812,557

(22) Filed: Mar. 21, 2001

(30) Foreign Application Priority Data

Mar. 27, 2000 (JP) ........................................ 2000-086201

(51) Int. Cl.$^7$ ............................................... H01Q 17/00
(52) U.S. Cl. ............................................... 342/4; 342/1
(58) Field of Search ........................................ 342/1–12

(56) References Cited

U.S. PATENT DOCUMENTS

| | | | | |
|---|---|---|---|---|
| 3,568,195 A | * | 3/1971 | Wesch et al. ................... | 342/1 |
| 3,631,492 A | * | 12/1971 | Suetake et al. ................. | 342/4 |
| 3,680,107 A | * | 7/1972 | Meinke et al. .................. | 342/1 |
| 5,381,149 A | * | 1/1995 | Dougherty et al. ............. | 342/1 |
| 5,708,435 A | * | 1/1998 | Kudo et al. ..................... | 342/1 |

FOREIGN PATENT DOCUMENTS

| | | |
|---|---|---|
| JP | 5-90832 A | 4/1993 |
| JP | 5-283884 A | 10/1993 |
| JP | 5-299870 A | 11/1993 |
| JP | 6-132691 A | 5/1994 |
| JP | 6-50799 B2 | 6/1994 |
| JP | 6-283878 A | 10/1994 |
| JP | 3041295 B1 | 3/2000 |

OTHER PUBLICATIONS

"Seminar on Recent Trends and Examples of Developments in Electromagnetic Wave Absorbers and Shield Materials", Kogyo Gijutsukai ed., Dec. 17, 1998 (Partial Translation).

* cited by examiner

*Primary Examiner*—Bernarr E. Gregory
(74) *Attorney, Agent, or Firm*—Oliff & Berridge, PLC (57) ABSTRACT

An electromagnetic wave absorber comprises: an electromagnetic wave reflector made of a metal plate; a tile-shaped first electromagnetic wave absorber section containing ferrite as a magnetic material and having surfaces one of which is adjacent to the wave reflector; and a second electromagnetic wave absorber section adjacent to the other surface of the first wave absorber section. The second wave absorber section includes a structure and a dielectric loss material. The structure includes a plurality of plate-shaped elements each of which is made of a magnetic loss material. These elements have surfaces that are located with specific spacing and orthogonal to the other surface of the first wave absorber section. The dielectric loss material is located at least part of the spaces between adjacent ones of the elements of the structure.

13 Claims, 12 Drawing Sheets

ELECTROMAGNETIC WAVE ABOSRBER

BACKGROUND OF THE INVENTION

1. Field of the Invention

The present invention relates to an electromagnetic wave absorber used for an anechoic chamber and so on.

2. Description of the Related Art

An anechoic chamber has been used as a facility for testing electromagnetic compatibility (EMC), such as measuring electromagnetic wave noise generated by an electronic apparatus with accuracy. The anechoic chamber has four walls and a ceiling on entire surfaces of which electromagnetic wave absorbers are placed to prevent electromagnetic waves from reflecting off the surfaces of the walls and the ceiling. In this chamber a turntable is provided, and measurement of radiation noise generated by an electronic apparatus placed on the turntable is performed, for example.

An electromagnetic wave absorber that is widely used for an anechoic chamber is made up of: an electromagnetic wave reflector of metal; a ferrite tile, that is, an electromagnetic wave absorber made of plate-shaped (tile-shaped) sintered ferrite; and a wedge-shaped or pyramid-shaped dielectric loss material. These components are stacked in this order.

There are anechoic chambers of different sizes, such as a 10 meter-test-range chamber and a 3 meter-test-range chamber, since the distance between a measuring instrument and an electronic apparatus varies depending on the size and so on of the electronic apparatus whose radiation noise is to be measured.

The regulation imposed on the radiation noise of electronic apparatuses strongly demands that emission of strong electromagnetic waves to the outside should be avoided. Therefore, to perform measurement of radiation noise with high reliability, a high-quality anechoic chamber that exhibits high measurement accuracy, stability and repeatability is required.

When an anechoic chamber facility is built, it is desired that each wave absorber is as small as possible in size, considering the limitations imposed on the construction site and costs. When radiation noise is measured, however, the region required for measurement depends on the area of the metal floor surface allocated and the size of the measuring antenna and so on. It is thus required to make the thickness of each of wave absorbers placed on the entire inner walls of the chamber as small as possible, while maintaining the region required for measurement in the chamber.

As thus described, thin electromagnetic wave absorbers that exhibit an excellent electromagnetic wave absorbing characteristic are desired for anechoic chambers.

Figure 13:
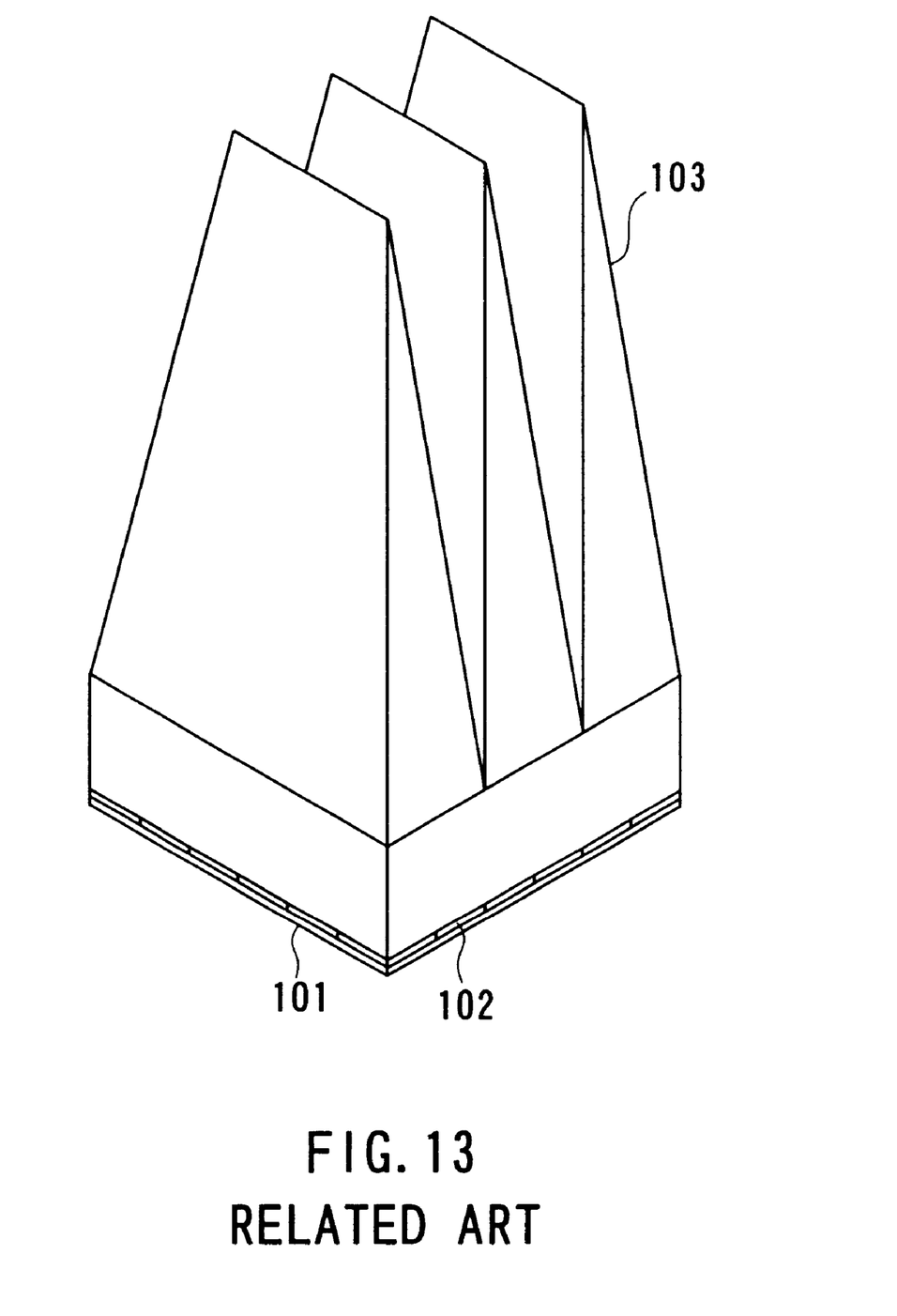
FIG. 13 is a perspective view of an example of external appearance of the related-art electromagnetic wave absorber.
Figure 14:
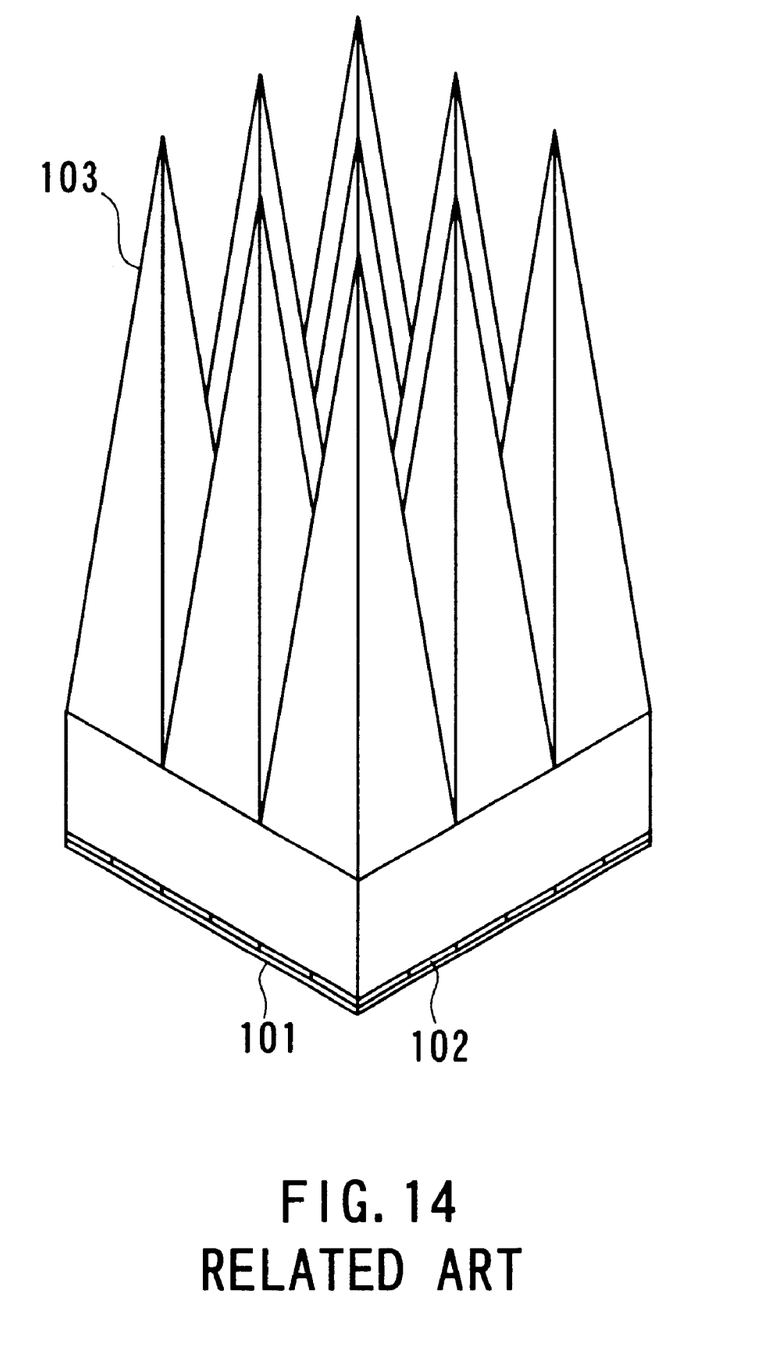
FIG. 14 is a perspective view of another example of external appearance of the related-art wave absorber.

FIG. 13 and FIG. 14 illustrate examples of external appearances of electromagnetic wave absorbers that have been used for the 10 meter-test-range chamber and the 3 meter-test-range chamber. Each of the absorbers shown is made up of an electromagnetic wave reflector 101 of metal, a ferrite tile 102 and a dielectric loss material 103 that are stacked in this order. The dielectric loss material 103 of the wave absorber of FIG. 13 is wedge-shaped. The dielectric loss material 103 of the wave absorber of FIG. 14 is pyramid-shaped. The thickness of a practically available wave absorber is about 100 to 200 cm for the 10 meter-test-range chamber and about 40 to 60 cm for the 3 meter-test-range chamber.

The electromagnetic wave absorber made of the combination of ferrite and dielectric loss material, such as the ones shown in FIG. 13 and FIG. 14, requires the dielectric loss material having a some degree of thickness, to obtain well-balanced wave absorbing characteristics in both a VHF band of 30 to 300 MHz and a UHF band of 300 MHz and greater. Therefore, the minimum thickness of the dielectric loss material of the wave absorber is about 100 cm for the 10 meter-test-range chamber, and about 30 cm for the 3 meter-test-range chamber. As thus described, it is difficult in prior art to implement thin wave absorbers that exhibit excellent electromagnetic wave absorbing characteristics.

A recently-known electromagnetic wave absorber utilizes a composite magnetic loss material, in place of the dielectric loss material, which is made of a resin such as polypropylene mixed with ferrite powder and formed into a hollow pyramid. However, the electromagnetic wave absorbing characteristic of this wave absorber is reduced in the vicinity of 30 MHz, that is, the minimum frequency of radiation noise measurement. It is therefore difficult to apply this absorber to an anechoic chamber that requires high-level characteristics. To solve this problem, the thickness of the absorber may be increased. However, if the thickness of the absorber is increased, the size of the chamber is required to be increased to obtain a greater effective space in the chamber, which will impose a limitation on the building site and increase building costs. In addition, the composite magnetic loss material simply made of a resin mixed with ferrite powder requires an increase in proportion of the ferrite powder or an increase in thickness of the magnetic loss substance in order to increase the magnetic loss. Manufacturing costs are thereby increased.

OBJECT AND SUMMARY OF THE INVENTION

It is an object of the invention to provide an electromagnetic wave absorber having a reduced thickness and an excellent electromagnetic wave absorbing characteristic.

An electromagnetic wave absorber of the invention comprises: an electromagnetic wave reflector; a first electromagnetic wave absorber section made of plate-shaped sintered ferrite and having surfaces one of which is adjacent to the wave reflector; and a second electromagnetic wave absorber section adjacent to the other surface of the first wave absorber section. The second wave absorber section includes: a structure including a plurality of plate-shaped elements each of which is made of a magnetic loss material, the elements having surfaces located with specific spaces each of which is created between adjacent ones of the elements, the surfaces being located in a direction intersecting the other surface of the first wave absorber section; and a dielectric loss material located in at least part of the spaces each of which is created between adjacent ones of the elements of the structure.

According to the electromagnetic wave absorber of the invention, an excellent electromagnetic wave absorbing characteristic is achieved by the first and second wave absorbing sections. In addition, it is possible to reduce the thickness of the second wave absorbing section and to thereby reduce the entire thickness of the wave absorber.

According to the electromagnetic wave absorber of the invention, the surfaces of the elements of the structure may be orthogonal to the other surface of the first wave absorber section.

According to the electromagnetic wave absorber of the invention, the second wave absorbing section may be entirely plate-shaped.

According to the electromagnetic wave absorber of the invention, each of the elements of the structure may have a thickness in a range of 0.5 to 2.5 mm inclusive, and the spaces each of which is created between adjacent ones of the elements may fall within a range of 10 to 50 mm inclusive.

According to the electromagnetic wave absorber of the invention, each of the elements of the structure may have a permittivity of 10 or smaller.

According to the electromagnetic wave absorber of the invention, the elements of the structure may contain ferrite. In this case, the ferrite that the elements contain may be Ni—Zn-type ferrite or Mn—Mg—Zn-type ferrite, and an amount of the ferrite that the elements contain may fall within a range of 70 to 85 weight % inclusive.

According to the electromagnetic wave absorber of the invention, the dielectric loss material may contain conductive particles.

According to the electromagnetic wave absorber of the invention, each of the spaces created between adjacent ones of the elements may be filled with the dielectric loss material. In this case, the dielectric loss material may contain conductive particles, and an amount of the conductive particles that the dielectric loss material contains may fall within a range of 1 to 11 grams per liter inclusive.

According to the electromagnetic wave absorber of the invention, the surfaces of the elements of the structure may be covered with the dielectric loss material. In this case, the dielectric loss material may contain conductive particles, and an amount of the conductive particles in an entire volume of the second wave absorbing section including an interior space thereof may fall within a range of 1 to 11 grams per liter inclusive.

According to the electromagnetic wave absorber of the invention, the following configuration is possible. Each of the elements of the structure is made of a base that is made of a hydrous inorganic compound or a resin and contains ferrite powder. The surfaces of the elements of the structure are orthogonal to the other surface of the first wave absorber section. The elements are arranged in one direction, or arranged to form any of a grid, a honeycomb and a corrugated shape. The dielectric loss material is made of a base that is made of a foam, a hydrous inorganic compound or a resin and contains carbon or graphite.

Other and further objects, features and advantages of the invention will appear more fully from the following description.

DETAILED DESCRIPTION OF THE PREFERRED EMBODIMENT

Figure 1:
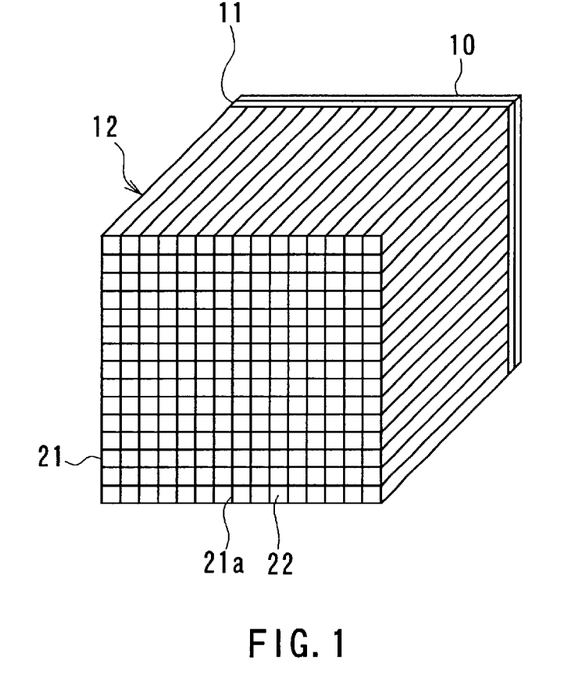
FIG. 1 is a perspective view of an example of a configuration of an electromagnetic wave absorber of an embodiment of the invention.
Figure 2:
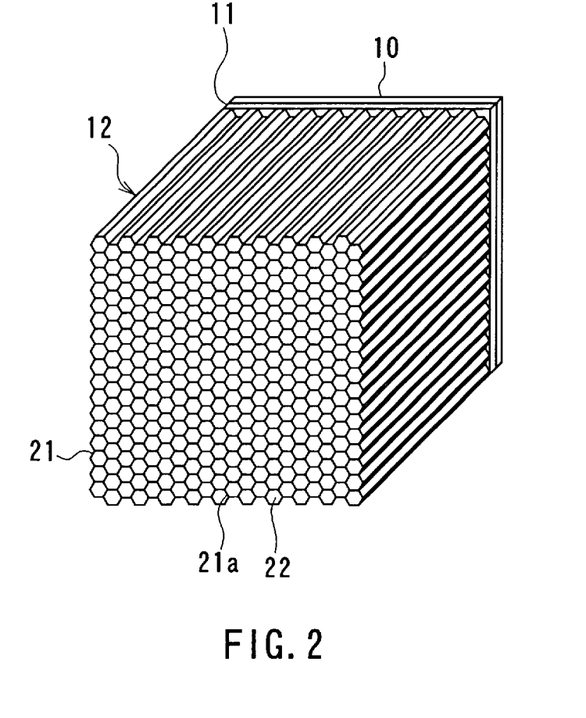
FIG. 2 is a perspective view of another example of configuration of the electromagnetic wave absorber of the embodiment.

A preferred embodiment of the invention will now be described in detail with reference to the accompanying drawings. FIG. 1 is a perspective view of an example of a configuration of an electromagnetic wave absorber of the embodiment of the invention. FIG. 2 is a perspective view of another example of the configuration of the wave absorber of the embodiment. As shown, the wave absorber comprises: an electromagnetic wave reflector 10 made of a metal plate; a first electromagnetic wave absorber section 11 made of plate-shaped sintered ferrite; and a second electromagnetic wave absorber section 12. A surface of the first wave absorber section 11 is adjacent to the wave reflector 10. The second wave absorber section 12 is adjacent to the other surface of the first wave absorber section 11.

The second wave absorber section 12 incorporates a structure 21 and dielectric loss materials 22. The structure 21 includes a plurality of plate-shaped elements 21a each of which is made of a magnetic loss substance. The elements 21a are placed with specific spacing such that surfaces thereof intersect one of the surfaces of the first wave absorber section 11 opposite to the reflector 10. The dielectric loss materials 22 are locates at least part of the spaces each of which is created between adjacent ones of the elements 21a of the structure 21. The entire second wave absorber section 12 may be plate-shaped, for example.

The first wave absorber section 11 converts electromagnetic wave energy to thermal energy through the use of the magnetic resonance loss of ferrite, and thereby absorbs radio waves.

The second wave absorber section 12 has the following configuration. The elements 21a of the structure 21 contains ferrite. The structure 21 is made of a sheet (hereinafter called ferrite paper) of hydrous inorganic compound as a base that contains ferrite powder, or a sheet of a resin as a base that contains ferrite powder. The ferrite paper may be formed by molding a mixture of ferrite powder and hydrous inorganic compound, or may be formed through a paper fabricating technique, using ferrite powder and a fiber-shaped base made of hydrous inorganic compound. Alternatively, the ferrite paper may be formed by applying ferrite powder to a fiber-shaped base made of hydrous inorganic compound, or impregnating this base with ferrite powder. The sheet made of ferrite and a resin may be formed by molding a mixture of ferrite powder and the resin.

The elements 21a of the structure 21 may be arranged in one direction, or may form a grid, a honeycomb or a corrugated shape, for example. FIG. 1 illustrates an example of arrangement in which the elements 21a form a grid. FIG. 2 illustrates an example of arrangement in which the elements 21a are honeycomb-shaped.

As will be described later, the ferrite that the elements 21a of the structure 21 contain is preferably Ni—Zn-type ferrite or Mn—Mg—Zn-type ferrite. The amount of ferrite in the elements 21a preferably falls within the range of 70 to 85 weight % inclusive.

Each of the elements 21a preferably has a thickness in the range of 0.5 to 2.5 mm inclusive. The space between adjacent ones of the elements 21a preferably falls within the range of 10 to 50 mm inclusive. The permittivity of the elements 21a is preferably 10 or smaller.

Each of the dielectric loss materials 22 may be located such that the spaces each of which is created between adjacent ones of the elements 21a of the structure 21 are filled with the dielectric loss materials 22. Alternatively, the dielectric loss materials 22 may cover the surfaces of the elements 21a. To have the spaces each of which is between adjacent ones of the elements 21a filled with the dielectric loss materials 22, the dielectric loss materials 22 may be made of a base of a foam, a hydrous inorganic compound, or a resin, for example, that contains carbon or graphite as conductive particles. The amount of carbon or graphite in the dielectric loss materials 22 preferably falls within the range of 1 to 11 grams per liter inclusive when the spaces each of which is between adjacent ones of the elements 21a are filled with the dielectric loss materials 22.

To cover the surfaces of the elements 21a of the structure 21 with the dielectric loss materials 22, the materials 22 may be formed by applying a conductive coating that contains carbon or graphite as conductive particles to the surfaces of the elements 21a. The amount of carbon or graphite in the entire volume of the second wave absorber section 12 including the interior space preferably falls within the range of 1 to 11 grams per liter inclusive when the dielectric loss materials 22 cover the surfaces of the elements 21a.

A method of designing the electromagnetic wave absorber of this embodiment and the characteristics thereof will now be described. The load impedance $Z_1^*$ (the asterisk indicating a complex number) at the interface between the first and second layers of a multilayer electromagnetic wave absorber is given by the following equation (1), as the normalized input impedance of a single-layer electromagnetic wave absorber.

$$Z_1^* = Z_{c1}^* tanh\ (\gamma_1^* d_1) \quad (1)$$

Next, if load impedance $Z_{n-1}^*$ obtained in the front surface of the $(n-1)^{th}$ layer is known, load impedance $Z_n^*$ of the $n^{th}$ layer is obtained from the following equation (2).

$$Z_n^* = Z_{cn}^* \{Z_{n-1}^* + Z_{cn}^* tanh\ (\gamma_n^* d_n)\} / \{Z_{cn}^* + Z_{n-1}^* tanh\ (\gamma_n^* d_n)\} \quad (2)$$

Therefore, the reflection coefficient of the multilayer wave absorber is obtained from the following equation (3).

$$|T^*| = |(Z_n^* - 1)/(Z_n^* + 1)| \quad (3)$$

$Z_{cn}^*$ is the normalized intrinsic impedance of the $n^{th}$ layer and written as $Z_{cn}^* = \sqrt{(\mu_{rn}^*/\epsilon_{rn}^*)}$. $\gamma_n^*$ is the propagation constant of the $n^{th}$ layer and written as $\gamma_n^* = j(2\pi/\lambda_0) \sqrt{(\mu_{rn}^* \cdot \epsilon_{rn}^*)}$. $d_n$ is the thickness of the $n^{th}$ layer. $\lambda_0$ is the wavelength of incident wave in vacuum. $\mu_{rn}^*$ is the complex relative permeability of the $n^{th}$ layer and written as $\mu_{rn}^* = \mu_{rn}' - j\mu_{rn}''$. $\epsilon_{rn}^*$ is the complex relative permittivity of the $n^{th}$ layer and written as $\epsilon_{rn}^* = \epsilon_{rn}' - j\epsilon_{rn}''$.

Figure 10:
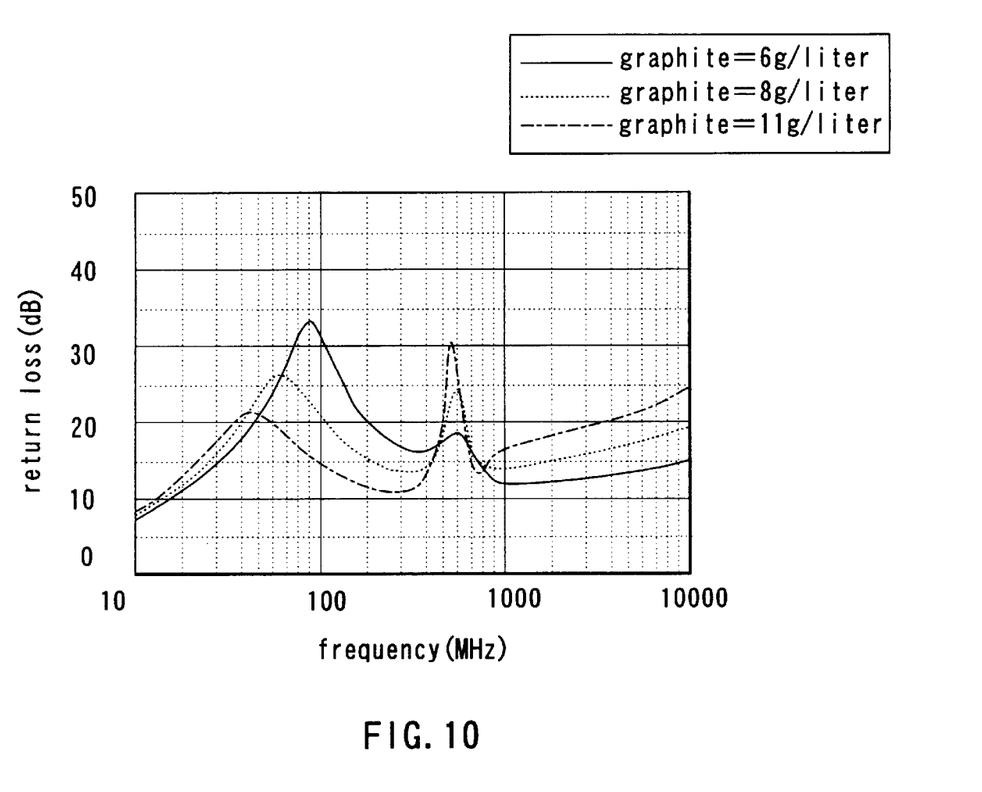
FIG. 10 is a plot of electromagnetic wave absorbing characteristic of reference wave absorbers to be compared with the wave absorber of the embodiment of the invention.

For comparison with the electromagnetic wave absorber of the embodiment of the invention, FIG. 10 shows electromagnetic wave absorbing characteristics of a reference electromagnetic wave absorber made up of an electromagnetic wave reflector, a ferrite tile and a Styrofoam containing graphite and having a thickness of 20 cm that are stacked in this order, wherein the amount of graphite contained is varied. As the amount of graphite increases, the return loss of this wave absorber decreases in a frequency band of 30 to 300 MHz, and increases at a frequency of 1 GHz or greater.

Therefore, it is noted that the dielectric loss material simply containing graphite and having a thickness of 20 cm is not capable of exhibiting an excellent electromagnetic wave absorbing characteristic in a wide frequency band of 30 to 1000 MHz, even though the balance in wave absorbing characteristic is achieved between the VHF band of 30 to 300 MHz and at the frequency of 1 GHz or greater.

The characteristic of the electromagnetic wave absorber of the embodiment of the invention will now be described, referring to the configuration in which the spaces each of which is between adjacent ones of the elements 21a of the structure 21 are filled with the dielectric loss material 22 as an example.

The complex relative permeability $\mu_r^*$ and the complex relative permittivity $\epsilon_r^*$ of the second wave absorber section 12 are written as follows in terms of composite electrical constant, where $\mu_{ra}^*$ and $\epsilon_{ra}^*$ are the complex relative permeability and the complex relative permittivity, respectively, of the magnetic loss material making up each of the elements 21a, and $\mu_{rb}^*$ and $\epsilon_{rb}^*$ are the complex relative permeability and the complex relative permittivity, respectively, of the dielectric loss material 22 with which the spaces each of which is between adjacent ones of the elements 21a are filled.

$$\mu_r^* = K_e \cdot \mu_{rb}^* + \{(1-K_e)\ \mu_{ra}^* \cdot \mu_{rb}^*\} / \{K_u \cdot \mu_{ra}^* + \{(1-K_u)\ \mu_{rb}^*\}$$

$$\epsilon_r^* = K_u \cdot \epsilon_{rb}^* + \{(1-K_u)\ \epsilon_{ra}^* \cdot \epsilon_{rb}^*\} / \{K_e \cdot \epsilon_{ra}^* + \{(1-K_e)\ \epsilon_{rb}^*\}$$

$$K_e = b2/(b1+b2)$$

$$K_u = a2/(a1+a2)$$

Figure 12:
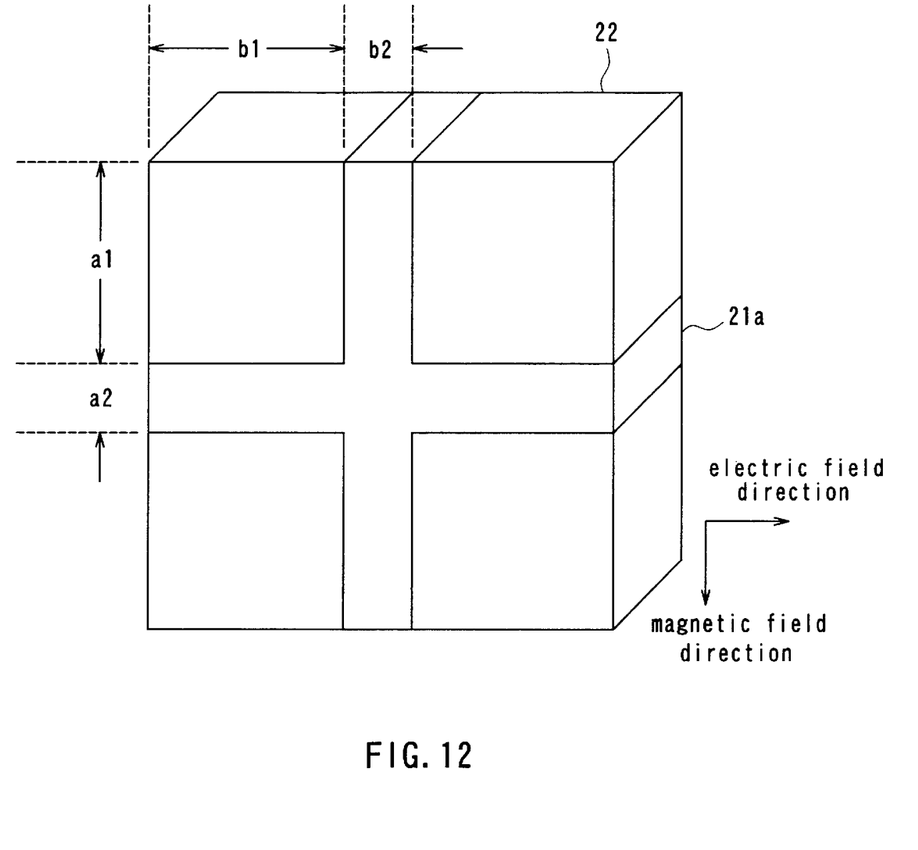
FIG. 12 is a view used for describing the coefficient pertinent to the characteristic of the wave absorber of the embodiment of the invention.

$K_e$ is the electric field void ratio. $K_u$ is the magnetic field void ratio. As shown in FIG. 12, b1 is the thickness of each of the elements 21a (magnetic loss material) measured in the direction of electric field. b2 is the space between two of the elements 21a neighboring along the direction of electric field. a1 is the continuous length of each of the elements 21a measured in the direction of magnetic field. a2 is the space between two of the elements 21a neighboring along the direction of magnetic field. The elements 21a nearly infinitely contiguous in the direction of magnetic field are dealt with in the calculation and rectangular stripline measurement.

The complex relative permittivity $\epsilon_r^*$ of the second wave absorber section 12 is nearly equivalent to the complex relative permittivity $\epsilon_{rb}^*$ of the dielectric loss material 22 with which the space between adjacent ones of the elements 21a is filled, if $\epsilon_{ra}^*$ of each of the elements 21a (magnetic loss material) is 10 or smaller, the thickness of each of the elements 21a is 0.5 to 2.5 mm, and the space between adjacent ones of the elements 21a is 10 to 50 mm. The complex relative permeability is written as $\mu_r^* = K_e + (1-K_e) \cdot \mu_{ra}^*$.

As thus described, in order to improve the electromagnetic wave absorbing characteristic of the wave absorber of the embodiment in the VHF band of 30 to 300 MHz, the thickness of each of the elements 21a and the space between adjacent ones of the elements 21a are determined such that the complex relative permeability and the complex relative permittivity of the second wave absorber section 12 in front of the first wave absorber section 11 are $\mu_r^* \approx \epsilon_r^*$, that is, $K_e + (1-K_e) \cdot \mu_{ra}^* \approx \epsilon_{rb}^*$ (the layer in front of the first wave absorbing section 11 is made free space impedance), so that the wave absorbing characteristic of the first wave absorber section 11 is fully exerted. At the frequency of 1 GHz or greater, a good electromagnetic wave absorbing characteristic is obtained, owing to the synergistic effect of the magnetic loss ($\mu_{ra}''$) of the elements 21a (magnetic loss material) and the dielectric loss ($\epsilon_{rb}''$) of the dielectric loss material 22.

Figure 8:
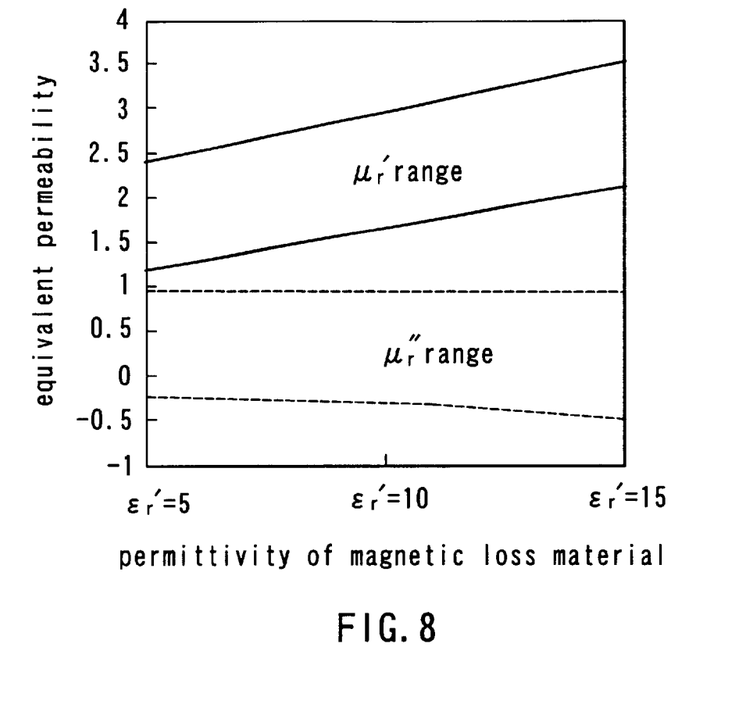
FIG. 8 is a plot showing the range of complex relative permeability of the second wave absorber section of the wave absorber of the embodiment of the invention that achieves a return loss of 20 dB or greater at a frequency of 100 MHz, wherein the permittivity of the magnetic loss material is used as a parameter.
Figure 9:
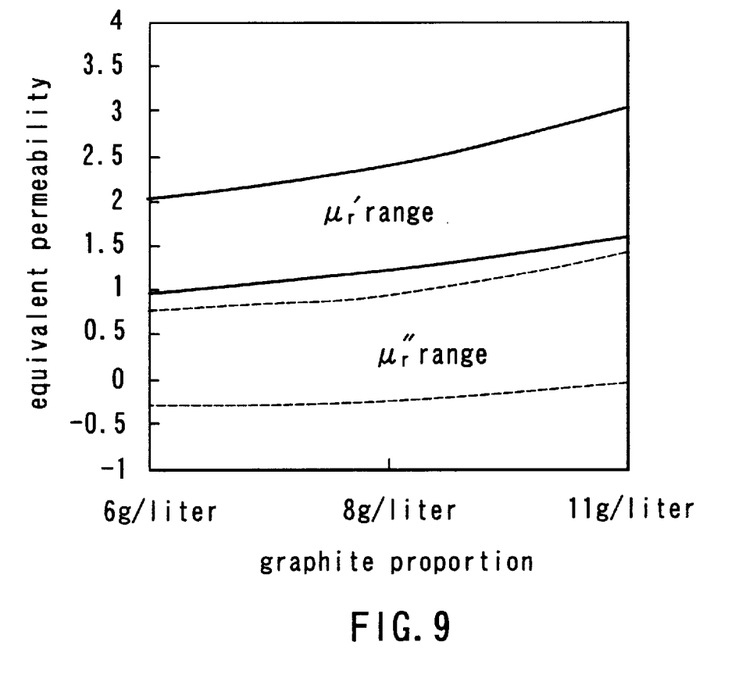
FIG. 9 is a plot showing the range of complex relative permeability of the second wave absorber section of the wave absorber of the embodiment that achieves a return loss of 20 dB or greater at a frequency of 100 MHz, wherein the amount of graphite that the dielectric loss material contains is used as a parameter.

FIG. 8 and FIG. 9 show the result of calculation for obtaining the range of $\mu_r'$ and $\mu_r''$, that is, the range of $\mu_r^*$ that achieves a return loss of 20 dB or greater at a frequency of 100 MHz, wherein the thickness of the second wave absorber section 12 is 20 cm, and the permittivity $\epsilon_r'$ of the magnetic loss material (the element 21a) and the amount of graphite that the dielectric loss material 22 contains are used as parameters.

As shown in FIG. 8, as the permittivity $\mu_r^*$ of the magnetic loss material (the element 21a) increases, the real term of $\mu_r'$ of $\mu_r^*$ increases. As the amount of graphite in the dielectric loss material 22 increases, the value of $\mu_r^*$ increases. Therefore, it is preferred that the permittivity of the magnetic loss material is low and the amount of graphite in the dielectric loss material 22 is small, so that an increase in the amount of magnetic particles charged between the elements 21a and an increase in the thickness of the elements 21a are suppressed. To reduce the permittivity of the magnetic loss material, ferrite contained therein is preferably Ni—Zn-type ferrite or Mn—Mg—Zn-type ferrite.

To suppress an increase in the amount of magnetic particles charged between the elements 21a and an increase in the thickness of the elements 21a, in particular, it is preferred that the permittivity of the magnetic loss material is 10 or smaller and the amount of graphite contained in the dielectric loss material 22 is 11 gram per liter or smaller.

To obtain an excellent electromagnetic wave absorbing characteristic at a frequency of 1 GHz or greater, the amount of graphite contained in the dielectric loss material 22 is preferably 6 gram per liter or greater.

If carbon is used for conductive particles contained in the dielectric loss material 22, the amount of carbon contained therein is preferably 3 grams per liter or smaller so as to suppress an increase in the amount of magnetic particles charged between the elements 21a and an increase in the thickness of the elements 21a.

To obtain an excellent electromagnetic wave absorbing characteristic at a frequency of 1 GHz or greater, the amount of carbon contained in the dielectric loss material 22 is preferably 1 gram per liter or greater.

When the spaces each of which is between adjacent ones of the elements 21a of the structure 21 are filled with the dielectric loss material 22, the amount of conductive particles contained therein preferably falls within the range of 1 to 11 grams per liter inclusive, considering the fact that the appropriate amount of conductive particles contained varies depending on the factors such as the type of conductive particles such as carbon or graphite, or the grain diameter of the conductive particles. When the dielectric loss materials 22 are placed to cover the surfaces of the elements 21a of the structure 21, the amount of conductive particles contained in the entire volume of the wave absorber section 12 including the interior space preferably falls within the range of 1 to 11 grams per liter inclusive.

As thus described, an excellent electromagnetic wave absorbing characteristic is obtained in a wide frequency band of 30 MHz and greater, according to the wave absorber of the embodiment wherein the second wave absorber section 12 is placed in front of the first wave absorber section 11, the second absorber section 12 incorporating: the structure 21 that includes the elements 21a made of magnetic loss material; and the dielectric loss materials 22 located at least part of the spaces each of which is between adjacent ones of the elements 21a.

Each of the wave reflector 10 and the first wave absorber section 11 has a thickness sufficiently smaller than the second wave absorber section 12. It is therefore possible that the wave absorber of this embodiment is as thin as 20 cm. It is thus possible to implement a thin electromagnetic wave absorber as thin as or thinner than one fiftieth of the wavelength of 30 MHz wave (10 meters).

According to the electromagnetic wave absorber of the embodiment, a low-priced anechoic chamber that exhibits high performance will be implemented.

Examples of the embodiment of the invention will now be described.

FIRST EXAMPLE

In a first example ferrite vinyl chloride resin sheets were utilized. Each of these sheets was made of vinyl chloride resin mixed with 85 weight % of Mn—Mg—Zn-type ferrite powder. The sheets were arranged to form a grid with a spacing of 20 mm to make the structure 21. Each space between adjacent ones of the elements 21a of the structure 21 was filled with the dielectric loss material 22 made of molded Styrofoam containing graphite. The second wave absorber section 12 as shown in FIG. 1 was thus fabricated.

In the first example nine types of second wave absorber sections 12 having the above-described configuration were fabricated. These sections 12 had different thicknesses of 0.5 mm, 1.0 mm and 2.0 mm. The amounts of graphite the molded Styrofoam contained were 6, 8 and 11 grams per liter. For comparison with the sections 12, reference samples made of only a dielectric loss material and having no ferrite vinyl chloride resin sheets were fabricated.

Next, each of the nine types of second wave absorber sections 12 and the reference samples was placed on the front surface of a 6.8-mm-thick ferrite tile provided as the first wave absorber section 11 backed with a metal plate as the wave reflector 10. Nine types of electromagnetic wave absorbers of this example and reference electromagnetic wave absorbers were thus fabricated. Electromagnetic wave absorbing characteristics of these wave absorbers were measured through the use of a rectangular stripline. According to this measurement, an amount of reflection was obtained for the reference while the terminating portion was shorted, and an amount of reflection was then obtained while each of the wave absorbers was inserted to the terminating portion. The ratio of this amount to the reference was determined to obtain the return loss.

Figure 3:
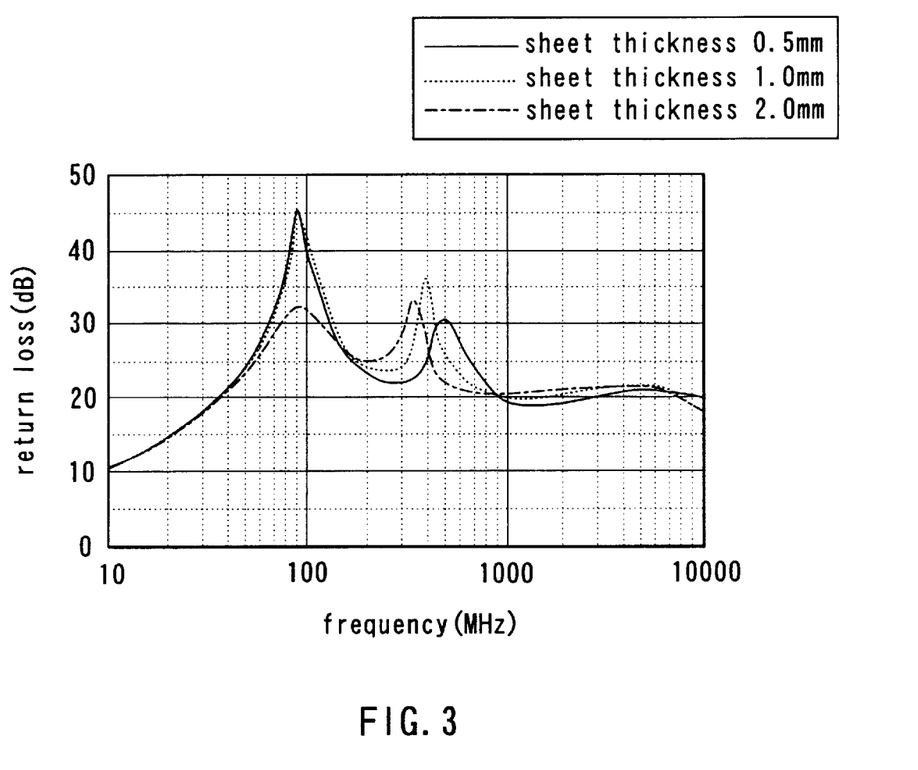
FIG. 3 is a plot showing examples of electromagnetic wave absorbing characteristics of wave absorbers of a first example of the embodiment of the invention.
Figure 4:
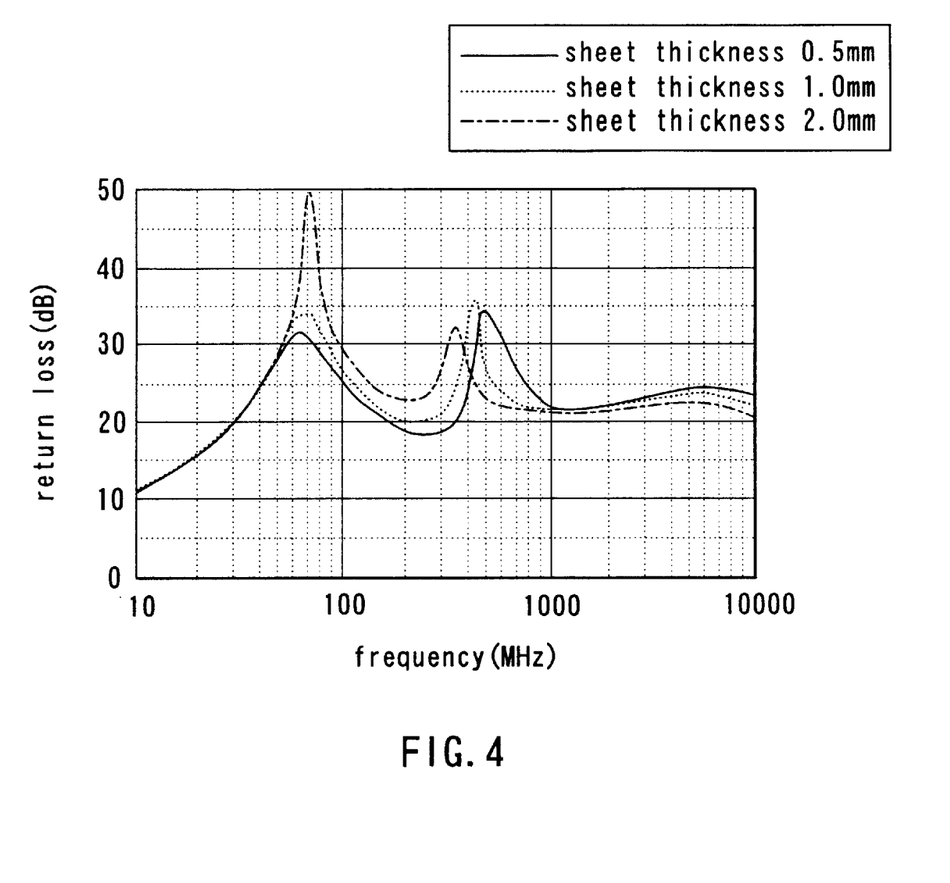
FIG. 4 is a plot showing examples of electromagnetic wave absorbing characteristics of wave absorbers of the first example.
Figure 5:
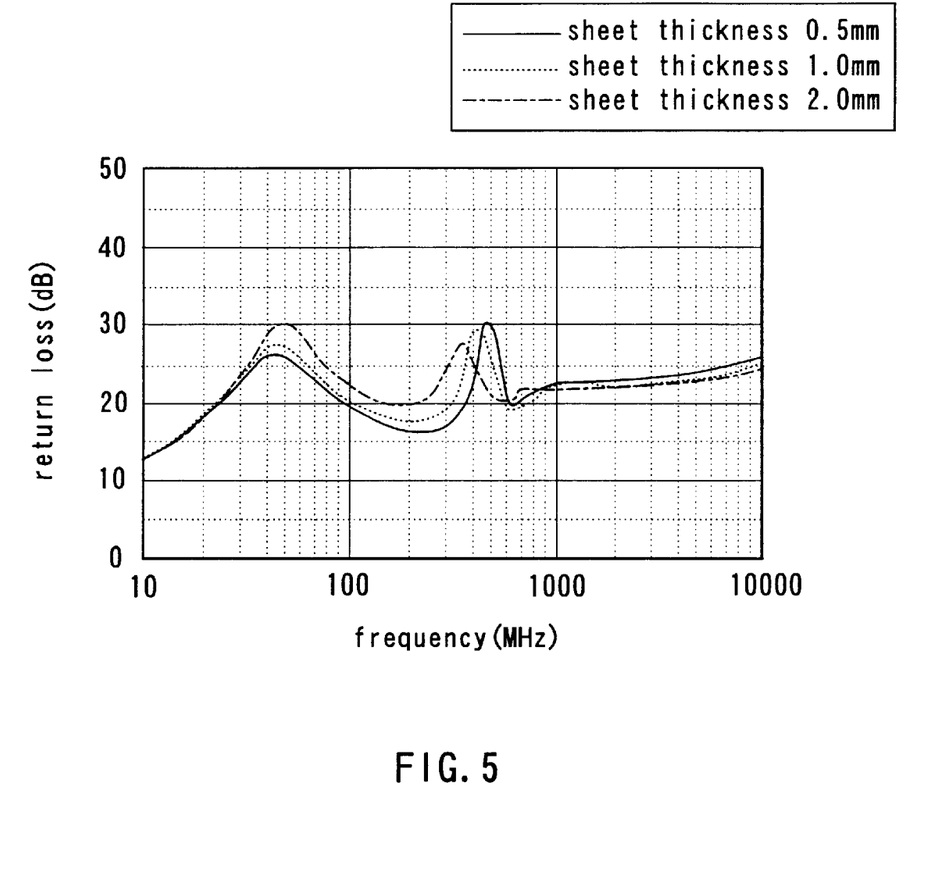
FIG. 5 is a plot showing examples of electromagnetic wave absorbing characteristics of wave absorbers of the first example.

FIG. 3 to FIG. 5 show examples of electromagnetic wave absorbing characteristics obtained where the amounts of graphite were 6, 8 and 11 grams per liter. FIG. 10 shows the electromagnetic wave absorbing characteristic of the reference wave absorbers that incorporated the reference samples, in place of the second wave absorber section 12. The wave absorbers of the first example of the embodiment of the invention exhibited better characteristics in a frequency band of 50 to 400 MHz and a band around 1 GHz, compared with the reference wave absorbers.

According to this example thus described, the wave absorbers that achieved a balance between the VHF band of 30 to 300 MHz and the UHF band of 300 MHz and greater were implemented.

A preferred thickness of the ferrite vinyl chloride resin sheets making up the structure 21 relates to the spacing with which the sheets are arranged. For example, when the spacing is 20 mm, a preferred thickness is 1.0 mm or greater. When the spacing is 10 mm, a preferred thickness is 0.5 mm or greater. When the spacing is 50 mm, a preferred thickness is 2.5 mm or greater. The resin with which ferrite is mixed may be any resin as long as it is capable of being plate-shaped.

SECOND EXAMPLE

In a second example ferrite paper was utilized. This paper was made of hydrous inorganic compound consisting of glass fiber, aramide fiber and magnesium silicate whose weight ratio was 2:1:1 with which 70 weight % of Mn—Mg—Zn-type ferrite powder was mixed. Sheets of this paper were arranged to form a grid with a spacing of 20 mm to make the structure 21. This paper was formed through a paper fabricating technique and pressing. Each space between adjacent ones of the elements 21a of the structure 21 was filled with the dielectric loss material 22 made of molded Styrofoam containing graphite. The second wave absorber section 12 as shown in FIG. 1 was thus fabricated.

In the second example three types of second wave absorber sections 12 having the above-described configuration were fabricated. The ferrite paper had a thickness of 1.0 mm. The amounts of graphite contained in the molded Styrofoam were 6, 8 and 11 grams per liter, respectively. For comparison with the sections 12, reference samples made of only a dielectric loss material and having no ferrite paper were fabricated.

Next, each of the three types of second wave absorber sections 12 and the reference samples was placed on the front surface of a 6.8-mm-thick ferrite tile provided as the first wave absorber section 11 backed with a metal plate as the wave reflector 10. Three types of electromagnetic wave absorbers of this example and reference electromagnetic wave absorbers were thus fabricated. Electromagnetic wave absorbing characteristics of these wave absorbers were measured through the use of a rectangular stripline. According to this measurement, an amount of reflection was obtained for the reference while the terminating portion was shorted, and an amount of reflection was then obtained while each of the wave absorbers was inserted to the terminating portion. The ratio of this amount to the reference was determined to obtain the return loss.

Figure 6:
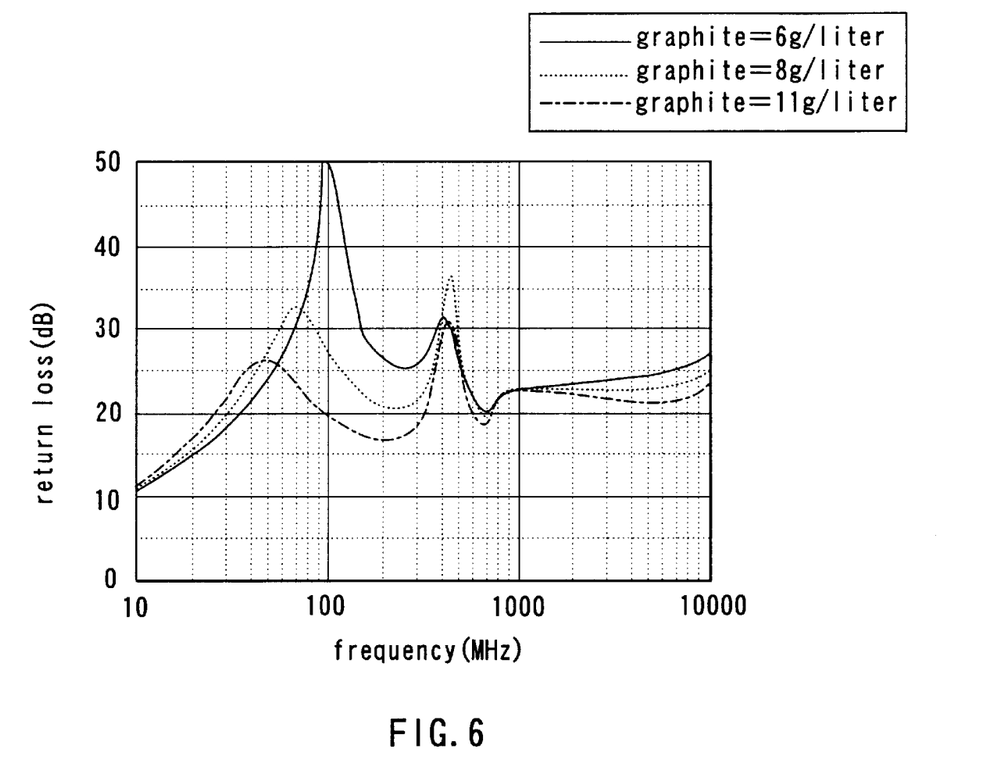
FIG. 6 is a plot showing examples of electromagnetic wave absorbing characteristics of wave absorbers of a second example of the embodiment of the invention.

FIG. 6 shows examples of electromagnetic wave absorbing characteristics of the above-mentioned three types of wave absorbers. FIG. 10 shows the electromagnetic wave absorbing characteristics of the reference wave absorbers that incorporated the reference samples, in place of the second wave absorber section 12. The wave absorbers of this second example of the embodiment of the invention exhibited better characteristics in a frequency band of 50 to 400 MHz and a band around 1 GHz, compared with the reference wave absorbers.

According to this example thus described, the wave absorbers that achieved a balance between the VHF band of 30 to 300 MHz and the UHF band of 300 MHz and greater were implemented.

According to the above-described result, the amount of ferrite that the ferrite paper contains is preferably 70 weight % or greater, and preferably 85 weight % or smaller, according to the result of the first example and practicality.

THIRD EXAMPLE

In a third example ferrite paper was utilized. This paper was made of hydrous inorganic compound consisting of glass fiber, aramide fiber and magnesium silicate whose weight ratio was 2:1:1 with which 70 weight % of Mn—Mg—Zn-type ferrite powder was mixed. Sheets of this paper were arranged to form a honeycomb to make the structure 21. This paper was formed through a paper fabricating technique and pressing. The space between adjacent ones of the elements 21a of the structure 21 was 20 mm. Next, a conductive coating that contains graphite was applied to surfaces of the elements 21a to form the dielectric loss materials 22. The second wave absorber section 12 as shown in FIG. 2 was thus fabricated.

In the third example three types of second wave absorber sections 12 having the above-described configuration were fabricated. The ferrite paper of these sections 12 had a thickness of 1.0 mm. The amounts of graphite contained in the entire volume of the respective second wave absorber sections 12 including the interior space were 6, 8 and 11 grams per liter, respectively. For comparison with the sections 12, reference samples made of a honeycomb-shaped structure, having a thickness of 20 cm and having no magnetic loss, to which a conductive coating containing graphite was applied, were fabricated.

Next, each of the three types of second wave absorber sections 12 and the reference samples was placed on the front surface of a 6.8-mm-thick ferrite tile provided as the first wave absorber section 11 backed with a metal plate as the wave reflector 10. Three types of electromagnetic wave absorbers of this example and reference electromagnetic wave absorbers were thus fabricated. Electromagnetic wave absorbing characteristics of these wave absorbers were measured through the use of a rectangular stripline. According to this measurement, an amount of reflection was obtained for the reference while the terminating portion was shorted, and an amount of reflection was then obtained while each of the wave absorbers was inserted to the terminating portion. The ratio of this amount to the reference was determined to obtain the return loss.

Figure 7:
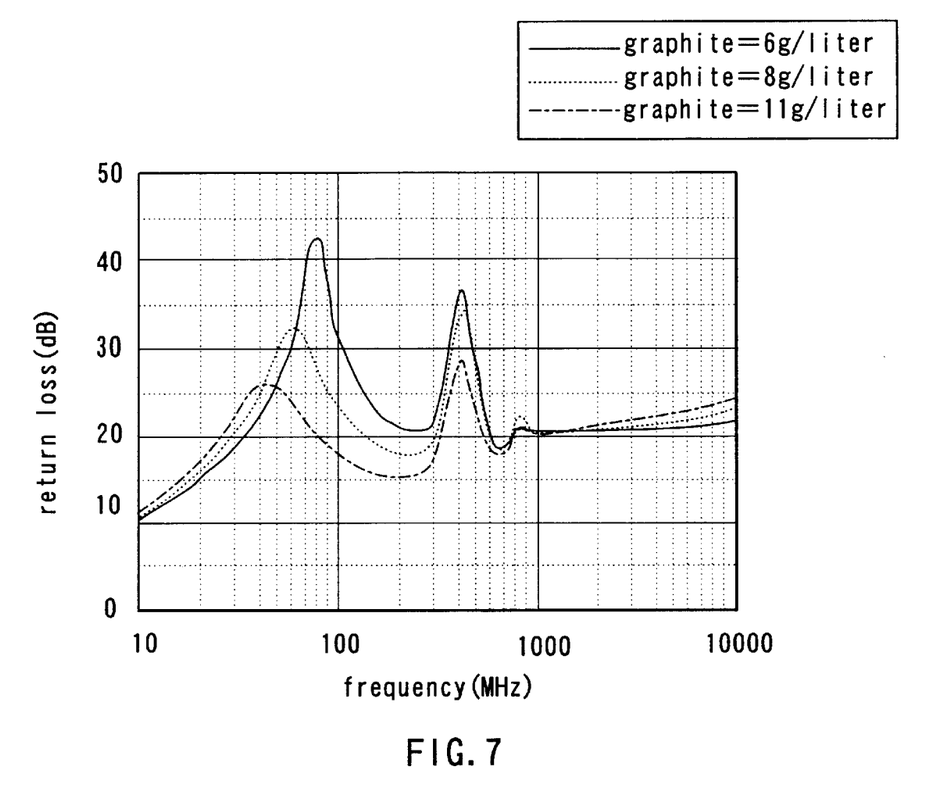
FIG. 7 is a plot showing examples of electromagnetic wave absorbing characteristics of wave absorbers of a third example of the embodiment of the invention.
Figure 11:
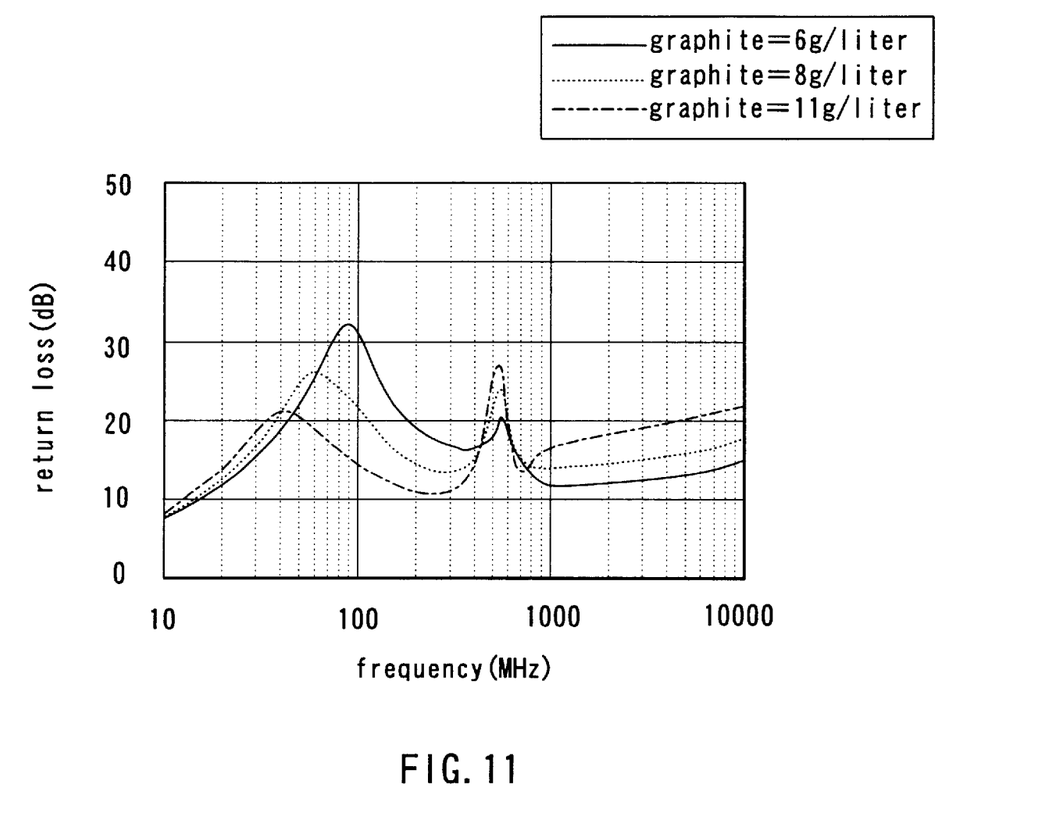
FIG. 11 is a plot of electromagnetic wave absorbing characteristic of reference wave absorbers to be compared with the wave absorber of the embodiment of the invention.

FIG. 7 shows examples of electromagnetic wave absorbing characteristics of the above-mentioned three types of wave absorbers. FIG. 11 shows the electromagnetic wave absorbing characteristics of the reference wave absorbers made of the reference samples, in place of the second wave absorbing section 12. The wave absorbers of this third example of the embodiment of the invention exhibited better characteristics in a frequency band of 50 to 400 MHz and a band around 1 GHz, compared with the reference wave absorbers.

According to this example thus described, the wave absorbers that achieved a balance between the VHF band of 30 to 300 MHz and the UHF band of 300 MHz and greater were implemented.

The present invention is not limited to the foregoing embodiment but may be practiced in still other ways. For example, the conductive particles that the dielectric loss material contains are not limited to carbon or graphite but may be metal powder or metal fiber.

According to the electromagnetic wave absorber of the invention described so far, an excellent electromagnetic wave absorbing characteristic is achieved by the first and second electromagnetic wave absorbing sections. In addition, it is possible to reduce the thickness of the second wave absorbing section and to thereby reduce the entire thickness of the wave absorber.

Obviously many modifications and variations of the present invention are possible in the light of the above teachings. It is therefore to be understood that within the scope of the appended claims the invention may be practiced otherwise than as specifically described.

What is claimed is:

1. An electromagnetic wave absorber comprising:

an electromagnetic wave reflector;

a first electromagnetic wave absorber section made of plate-shaped sintered ferrite and having surfaces one of which is adjacent to the wave reflector; and a second electromagnetic wave absorber section adjacent to the other surface of the first wave absorber section; wherein the second wave absorber section includes:

a structure including a plurality of plate-shaped elements each of which is made of a magnetic loss material, the elements having surfaces located with specific spaces each of which is created between adjacent ones of the elements, the surfaces being located in a direction intersecting the other surface of the first wave absorber section; and a dielectric loss material located in at least part of the spaces each of which is created between adjacent ones of the elements of the structure.

2. The electromagnetic wave absorber according to claim 1 wherein the surfaces of the elements of the structure are orthogonal to the other surface of the first wave absorber section.

3. The electromagnetic wave absorber according to claim 1 wherein the second wave absorbing section is entirely plate-shaped.

4. The electromagnetic wave absorber according to claim 1 wherein each of the elements of the structure has a thickness in a range of 0.5 to 2.5 mm inclusive, and the spaces each of which is created between adjacent ones of the elements falls within a range of 10 to 50 mm inclusive.

5. The electromagnetic wave absorber according to claim 1 wherein each of the elements of the structure has a permittivity of 10 or smaller.

6. The electromagnetic wave absorber according to claim 1 wherein the elements of the structure contain ferrite.

7. The electromagnetic wave absorber according to claim 6 wherein the ferrite that the elements contain is Ni—Zn-type ferrite or Mn—Mg—Zn-type ferrite, and an amount of the ferrite that the elements contain falls within a range of 70 to 85 weight % inclusive.

8. The electromagnetic wave absorber according to claim 1 wherein the dielectric loss material contains conductive particles.

9. The electromagnetic wave absorber according to claim 1 wherein each of the spaces created between adjacent ones of the elements is filled with the dielectric loss material.

10. The electromagnetic wave absorber according to claim 9 wherein the dielectric loss material contains conductive particles, and an amount of the conductive particles that the dielectric loss material contains falls within a range of 1 to 11 grams per liter inclusive.

11. The electromagnetic wave absorber according to claim 1 wherein the surfaces of the elements of the structure are covered with the dielectric loss material.

12. The electromagnetic wave absorber according to claim 11 wherein the dielectric loss material contains conductive particles, and an amount of the conductive particles in an entire volume of the second wave absorbing section including an interior space thereof falls within a range of 1 to 11 grams per liter inclusive.

13. The electromagnetic wave absorber according to claim 1 wherein:

each of the elements of the structure is made of a base that is made of a hydrous inorganic compound or a resin and contains ferrite powder;

the surfaces of the elements of the structure are orthogonal to the other surface of the first wave absorber section;

the elements are arranged in one direction, or arranged to form any of a grid, a honeycomb and a corrugated shape; and the dielectric loss material is made of a base that is made of a foam, a hydrous inorganic compound or a resin and contains carbon or graphite.

* * * * *

UNITED STATES PATENT AND TRADEMARK OFFICE
CERTIFICATE OF CORRECTION

PATENT NO. : 6,359,581 B2
DATED : March 19, 2002
INVENTOR(S) : Hiroshi Kurihara et al.

It is certified that error appears in the above-identified patent and that said Letters Patent is hereby corrected as shown below:

<u>Title page, Item [54], and Column 1, line 1,</u>
In the title, replace "ABOSRBER" with -- ABSORBER --.

<u>Column 5,</u>
Equation 3, replace "$|T^*| = |(Z_n{}^*-1)/(Z_n{}^* + 1)|$ ...(3)" with
-- $|\Gamma^*| = |(Z_n{}^*-1)/(Z_n{}^* +1)|$ ...(3) --.

Signed and Sealed this

Eleventh Day of June, 2002

Attest:

Attesting Officer

JAMES E. ROGAN
*Director of the United States Patent and Trademark Office*